United States Patent
Ho et al.

(10) Patent No.: US 6,670,675 B2
(45) Date of Patent: Dec. 30, 2003

(54) DEEP TRENCH BODY SOI CONTACTS WITH EPITAXIAL LAYER FORMATION

(75) Inventors: Herbert L. Ho, Cornwall, NY (US); S. Sundar K. Iyer, Beacon, NY (US); Babar A. Khan, Ossining, NY (US); Robert Hannon, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 09/922,892

(22) Filed: Aug. 6, 2001

(65) Prior Publication Data

US 2003/0025157 A1 Feb. 6, 2003

(51) Int. Cl.[7] .............................................. H01L 27/01
(52) U.S. Cl. ....................... 257/347; 257/348; 257/349; 438/149; 438/479; 438/517
(58) Field of Search ................................. 257/347, 349, 257/350; 438/149, 479, 517

(56) References Cited

U.S. PATENT DOCUMENTS

| | | | | |
|---|---|---|---|---|
| 5,185,280 A | * | 2/1993 | Houston et al. | ............... 437/44 |
| 5,461,250 A | * | 10/1995 | Burghartz et al. | ........... 257/347 |
| 5,554,870 A | * | 9/1996 | Fitch et al. | ................... 257/334 |
| 5,606,188 A | | 2/1997 | Bronner et al. | |
| 5,654,573 A | * | 8/1997 | Oashi et al. | ................. 257/349 |
| 5,742,075 A | * | 4/1998 | Burns et al. | ................... 257/59 |
| 5,889,293 A | * | 3/1999 | Rutten et al. | .................. 257/74 |
| 6,320,225 B1 | * | 11/2001 | Hargrove et al. | ........... 257/347 |
| 6,429,477 B1 | * | 8/2002 | Mandelmann et al. | ...... 257/301 |

OTHER PUBLICATIONS

Robert Hannon et al., "0.25 $\mu$m Merged Bulk DRAM and SOI Logic using Patterned SOI," *IEEE 2000 Symposium on VLSI Technology Digest of Technical Papers*, pp. 66 and 67.

* cited by examiner

Primary Examiner—Eddie Lee
Assistant Examiner—Edgardo Ortiz
(74) Attorney, Agent, or Firm—Ira D. Blecker

(57) ABSTRACT

A silicon-on-insulation (SOI) body contact is formed within a device region of an SOI substrate so that no space of the SOI substrate is wasted for implementing a body contact. The body contact is formed by epitaxially growing silicon and depositing polysilicon. An electrical device can be formed to overlie the body contact. Thus, no additional circuitry or conductive path is required to electrically connect a body contact and a device region. Also, the body contact provides a predictable electrical characteristics without sacrificing the benefits attained from using the SOI substrate and conservation surface space on the semiconductor die.

15 Claims, 3 Drawing Sheets

DEEP TRENCH BODY SOI CONTACTS WITH EPITAXIAL LAYER FORMATION

BACKGROUND OF THE INVENTION

1. Field of the Invention

The present invention generally relates to a semiconductor device having a silicon-on-insulator (SOI) substrate and, more particularly, to formation of a deep trench contact in the SOI substrate.

2. Background Description

Integrated circuit technology relies on transistors to formulate vast arrays of functional circuits. The complexity of these circuits requires the use of an ever increasing number of linked transistors. As the number of transistors required increases, the surface area that can be dedicated to a single transistor declines. It is desirable then, to construct transistors which occupy less surface area on the silicon chip/die.

In one example, integrated circuit technology uses transistors conjunctively with Boolean algebra to create a myriad of digital circuits, also referred to as logic circuits. In a typical arrangement, transistors are combined to switch or alternate an output voltage between just two significant voltage levels, labeled logic 0 and logic 1. In an alternate example, integrated circuit technology similarly uses transistors combined with capacitors to form memory cells. Here, the data is stored in electronic form as a charge on the capacitor. The charge, or absence of charge, on the capacitor translates to either a logic 1 or 0. Most logic systems use positive logic, in which logic 0 is represented by zero volts, or a low voltage, e.g., below 0.5 V; and logic 1 is represented by a higher voltage.

Integrated circuits, including transistors, are typically formed from either bulk silicon starting material, silicon on insulator (SOI) starting material, or SOI material that is formed from a bulk semiconductor starting material during processing. The SOI complementary metal oxide semiconductor (CMOS) technology, however, has been viewed as a likely successor to conventional bulk technology since it provides a prospect of greater circuit performance. This increase in performance results from the lower parasitic junction capacitances and the improved transistor characteristics and tolerances. Basic to the feature of isolating the active silicon layer from the substrate by an intervening insulator layer is the so called "floating body" effect on device characteristics. Since the bodies of individual devices are not in direct electrical contact to the conducting substrate, their electrical potential can vary with time depending on leakage currents and parasitic capacitive coupling to other electrodes. Such an effect is clearly undesirable for products based on SOI technologies.

One approach to handle the uncertain body potential is to include margins within the circuit design to allow for the floating body effect. While this requires no technology action, it diminishes the performance benefits of SOI. Another approach is to minimize the floating body effect by providing an enhanced leakage path to the device body from the device source. This is a partial solution since it merely limits the amount by which the body potential may vary relative to the source and does not allow the voltage to be set at any particular optimum value. Further, it necessarily creates an electrically asymmetric device which limits its acceptability.

Other techniques include providing a separate conducting contact to the device bodies. For example, FIG. 1 shows an SOI substrate divided into a peripheral region A and a device region B. A transistor is formed on the SOI substrate within the device region B. A gate electrode 22 is formed on the top substrate layer 14 with a gate oxide 20 therebetween, and source/drain regions 24 are formed in the top substrate layer 14 with a channel region therebetween. In the peripheral area A, a body contact 16 is formed between a top substrate layer 14 and a body substrate 10 via a buried contact 12. However, this approach has proven cumbersome and comes at the price of increased chip sizes since an extra space for the body contact 16 and additional circuitry is required next to the device region B.

Thus what is needed is an improved method and structure for implementing SOI transistors, or devices, which provide a predictable electrical potential in the body of the device without sacrificing the benefits attained from using the SOI structure. An improved method and structure should also conserve surface space on the semiconductor die and maximize device density.

SUMMARY OF THE INVENTION

It is therefore an object of the present invention to provide an SOI device which conserves space on the semiconductor die without sacrificing the benefit attained from using the SOI structure.

Another object of the present invention is to provide a simplified but yet effective SOI body contact structure which does not require additional circuitry.

Still another object of the present invention is to provide a simplified and effective manufacturing method for an SOI device having a body contact.

Additional advantages and other features of the present invention will be set forth in part in the description which follows and will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising an SOI substrate having top and bottom semiconductor layers separated by an insulator therebetween. Local insulation regions are formed in the top semiconductor layer of said SOI substrate. The local insulation regions define a device region. A contact is formed within said device region and extends between said top and bottom silicon layers and electrically connects said top and bottom semiconductor layers.

Another aspect of the present invention is a method for manufacturing a semiconductor device on an SOI substrate. The SOI substrate comprises top and bottom semiconductor layers and a buried insulation layer therebetween. The method comprises a step of defining a device region and a peripheral region in said SOI substrate. A contact is formed which extends from the top to bottom semiconductor layers via the buried insulation layer and electrically connects the top and bottom semiconductor layers. The contact is formed within the device region. An electric device is formed on the SOI substrate within the device region.

Thus, according to the present invention, a body contact is formed within the device region of an SOI substrate and an electric device, e.g., transistor is formed within the device region. This ensures a predictable electrical characteristics of the SOI device and conserves surface space on the die while still attaining the benefits from using the SOI structure.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not restrictive.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention provides an improved structure and method for implementing SOI transistors or devices, which provide predictable electrical characteristics without sacrificing the benefits attained from using the SOI substrate while still conserving surface space on the semiconductor die. These are achieved by forming a body contact between top and bottom semiconductor layers of the SOI substrate within a device region.

Previously, it has been observed that, according to the conventional approach to improve the floating body effect in SOI devices, a body contact was provided outside of the device region, which increases surface space of the semiconductor die.

Figure 1:
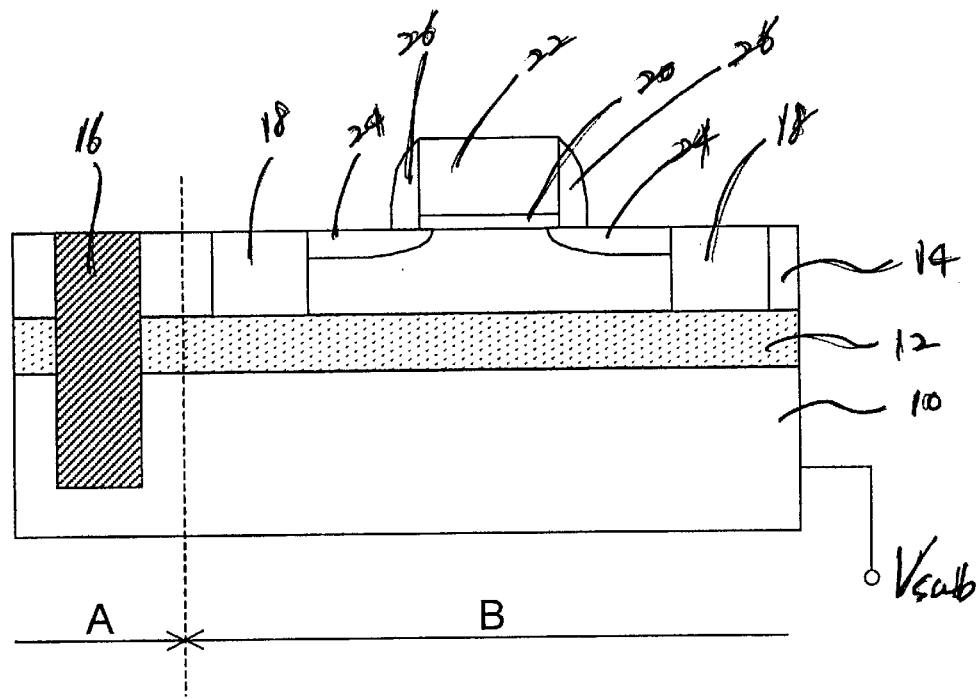
FIG. 1 depicts a cross section of a conventional SOI structure having a body contact formed outside of a device region.
Figure 2:
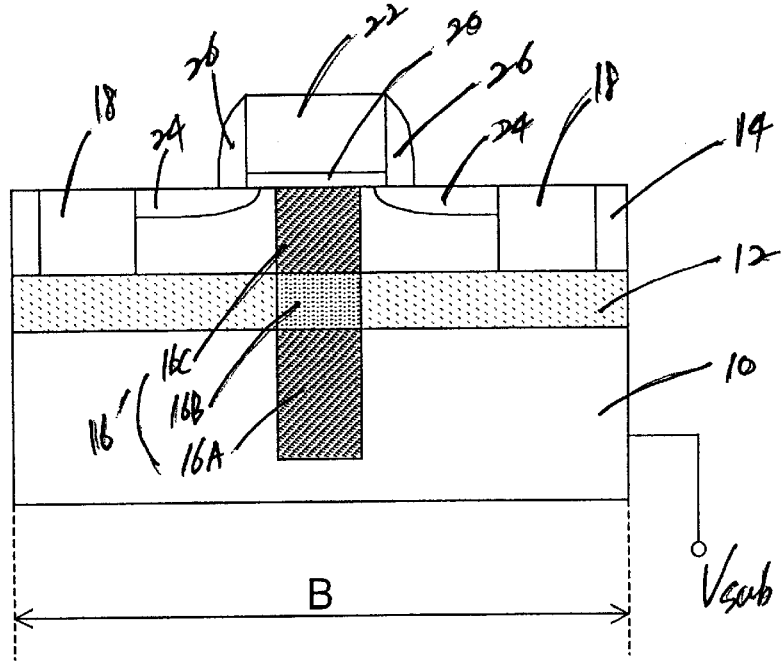
FIG. 2 depicts a cross section of an SOI structure having a body contact formed within a device region, in accordance with the present invention.

With this in mind, FIG. 2 depicts a device region B of an SOI substrate with a body contact 16'. The SOI substrate has top and bottom semiconductor layers 14 and 10 which are separated by a buried insulation layer 12. The body contact 16' is formed within the device region B, extending from the top semiconductor layer 14 to the bottom semiconductor layer 10 to form an electrical contact therebetween.

According to an embodiment of the present invention, in order to define and separate the device region B from a peripheral region, which is not shown in FIG. 2, of the SOI device, local insulation areas 18 are formed on the top semiconductor layer 14.

A transistor is formed on the SOI substrate within the device region B. FIG. 2 particularly shows a metal oxide semiconductor field effect transistor (MOSFET) having a gate electrode 22 formed on the top semiconductor layer 14 with a gate oxide 20 therebetween, source/drain regions 24 formed in the top semiconductor layer 14 with a channel region therebetween, and sidewall spacers 26 formed on the sidewalls of gate electrode 22.

Although FIG. 2 particularly depicts the transistor positioned to overlie the body contact 16', the positions of the transistor and the body contact 16' can be varied depending on the applications, e.g., device region size, transistor size or body contact size.

As shown in FIG. 2, the body contact 16' is preferably a trench contact which extends from the top surface of the top semiconductor layer 14 via the buried insulation layer 12 to the bottom semiconductor layer 10. Since, a transistor may be positioned to overlie the body contact 16', preferably the body contact 16' is formed of a material or materials having material characteristics substantially similar to those of the top and bottom semiconductor layers 14, 10. Specifically, the material for the body contact 16' is selected from the materials having a lattice structure which is substantially the same to that of the top and bottom semiconductor layers 14, 20. For example, in the case that silicon is used for the top and bottom semiconductor layers 10, 14, the body contact material can be any material having a matching lattice structure with silicon, e.g., intrinsic silicon, SiGe, GaAs, etc.

According to an embodiment of the present invention, the body contact 16' comprises bottom, middle and top portions 16A, 16B, 16C. The top and bottom portions 16C and 16A are surrounded by the top and bottom semiconductor layers 14 and 10, respectively, and preferably formed of epitaxial silicon. The middle portion 16B of the body contact 16' is surrounded by the buried insulation layer 12, and preferably formed of polysilicon to provide a firm conductive path between the top and bottom epitaxial silicon portions 16C and 16A of the body contact 16'. Thus, the body contact 16' ensures the silicon-substrate-likeness to avoid substantial change of the electrical characteristics of the substrate while still providing an electrical connection between the top and bottom semiconductor layer 14 and 10.

Therefore, according to the present invention, no space of the SOI substrate is wasted for implementing a body contact, no additional circuitry or conductive path is required to electrically connect a body contact and a device region, but it still provides predictable electrical characteristics without sacrificing the benefits attained from using the SOI substrate and conservation surface space on the semiconductor die.

Figure 3A:
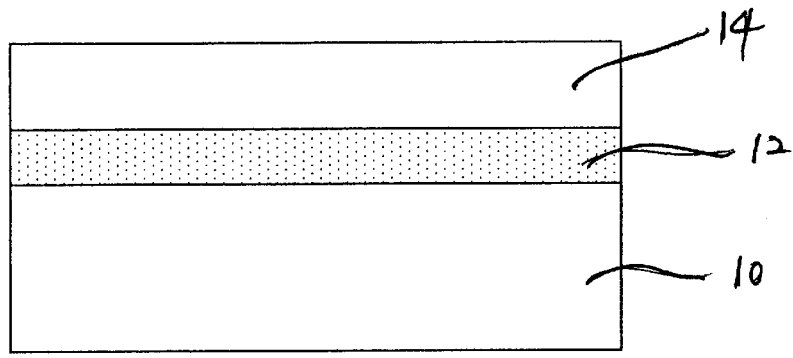
FIG. 3A depicts a cross section of a portion of an SOI substrate comprising top and bottom semiconductor layers and a buried insulation layer therebetween, in accordance with the present invention.

FIGS. 3A to 3F depict a method for manufacturing an SOI device having a body contact according to the present invention. In FIG. 3A, there is shown a portion of a typical SOI substrate comprising top and bottom semiconductor layers 14 and 10 separated by a buried insulation layer 12 formed therebetween. During the circuitry design step, the SOI substrate is divided into a device region and a peripheral region, and electric devices, i.e., circuitry array are formed within the device region. Since, according to the present invention, the formation of a body contact does not require any space within the peripheral region, only a portion of the device region is shown in FIG. 3A.

Usually, the top and bottom semiconductor layers 14 and 10 are silicon, and the buried insulation layer 12 is an oxide layer. The SOI substrate is preconditioned for the subsequent SOI device formation process. For example, the thickness of the top semiconductor layer 14 is preconditioned to be in the range between about 70 nm and about 150 nm.

Figure 3B:
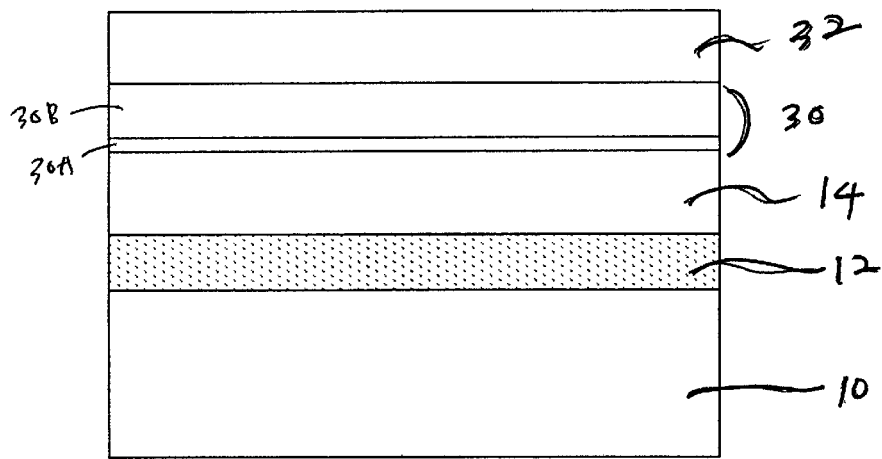
FIG. 3B depicts the portion of FIG. 3A after a pad film stack and a mask layer is formed on the SOI substrate.

As shown in FIG. 3B, a pad film stack 30 is formed on the top semiconductor layer 14. The pad film stack 30 comprises a pad oxide film 30A and a pad nitride film 30B, respectively formed by oxide growth and nitride deposition steps. A mask layer 32, preferably a hard mask, is formed on the pad film stack 30. The mask layer 32 is preferably formed by depositing BSG (boron silicate glass) at a thickness sufficient to ascertain that a trench, which will be formed later, has a certain depth to reach the bottom semiconductor layer 10.

Figure 3C:
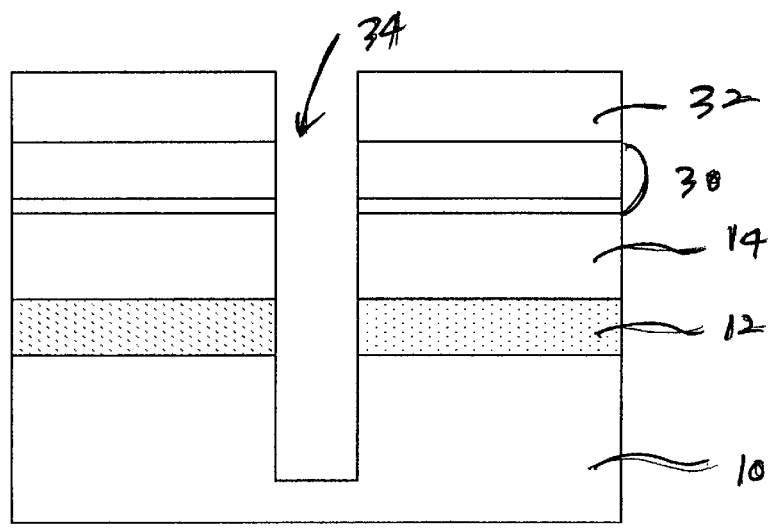
FIG. 3C depicts the portion of FIG. 3B after a trench formation process.

FIG. 3C depicts a trench 34 is formed in the SOI substrate. The trench 34 can be formed by conventional lithography and trench etching techniques by using a single masking and etching steps by using the mask layer 32. However, if necessary, multiple masking and etching steps can be used to form the trench 34 to shape the trench 34 in a better form. For example, the mask layer 32 is formed and patterned to expose a portion of the pad film stack 30 and an etching step is performed to form a partial trench extending to the top semiconductor layer 41 or the buried insulating layer 12. Then, the second masking and etching steps are performed to form the trench 34 fully extending to the bottom semiconductor layer 10. A circular trench is preferred if, as will be shown later, the trench 34 is filled by epitaxially growing silicon, in order to minimize generation of misfit dislocations in the center of the epitaxial silicon. After forming the trench 34, the mask layer 32 is removed.

Figure 3D:
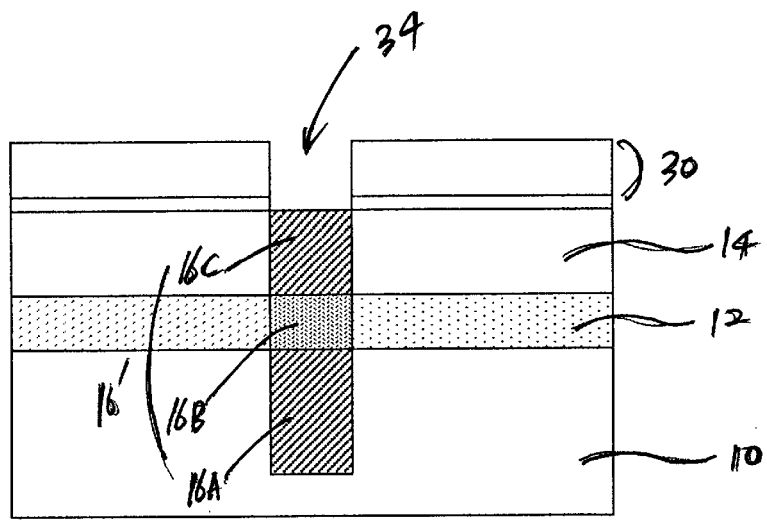
FIG. 3D depicts the portion of FIG. 3C after a trench filling process.

As FIG. 3D depicts, the trench 34 is filled with a material or materials to form a body contact 16' which provides a conductive path between connect the top and bottom semiconductor layers 16C and 16A of the SOI substrate. According to an embodiment of the present invention, the trench 34 is filled by an epitaxy process. The trench filling material is preferably selected from the materials having a lattice structure matching with that of the top and bottom semiconductor layers 16C and 16A, e.g., intrinsic silicon, SiGe, GaAs, etc. Prior to the epitaxy process, a baking step may be required in a $H_2$ ambient at a temperature between about 800° C. and about 1000° C. in order to ensure an oxide free surface.

The epitaxial growth of silicon within the trench 34 is typically dictated by the exposed silicon side surfaces of the trench 34, and the epitaxial silicon grows laterally towards the center of the trench 34. For these reasons, the trench 34 with a circular shape is preferred to ensure complete filling thereof.

According to an embodiment of the present invention, the trench 34 is filled by a single epitaxial step to form the body contact 16'. In the case that the buried insulation layer 12 is an oxide, the middle portion of the trench 34 surrounded by the buried insulation layer 12 does not develop epitaxial silicon growth and, therefore, may not be fully filled with epitaxial silicon. Instead, polysilicon may be formed to fill the portion of the middle portion where epitaxial silicon is not developed. Thus, during the epitaxial silicon growth step, the middle portion could be filled by polysilicon, a mixture of polysilicon and epitaxial silicon or epitaxial silicon.

Figure 3E:
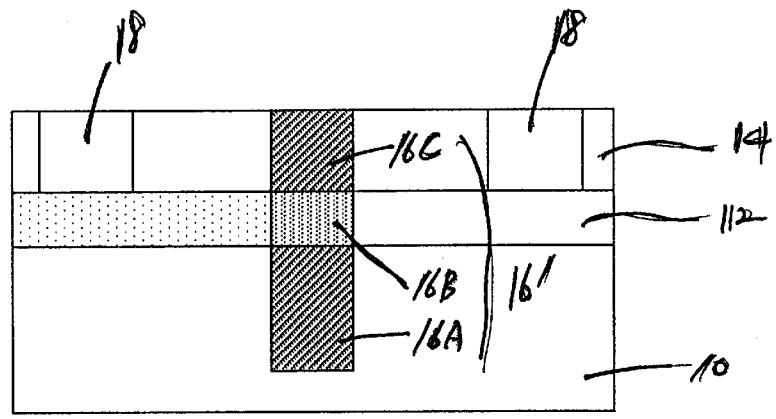
FIG. 3E depicts the portion of FIG. 3D after removing the pad film stack and mask layer from the SOI substrate.

Upon completing the body contact 16' formation, as shown in FIG. 3E, the pad film stack 30 is removed, and local insulation areas 18 are formed on the SOI substrate to isolate the device region from the peripheral region.

Figure 3F:
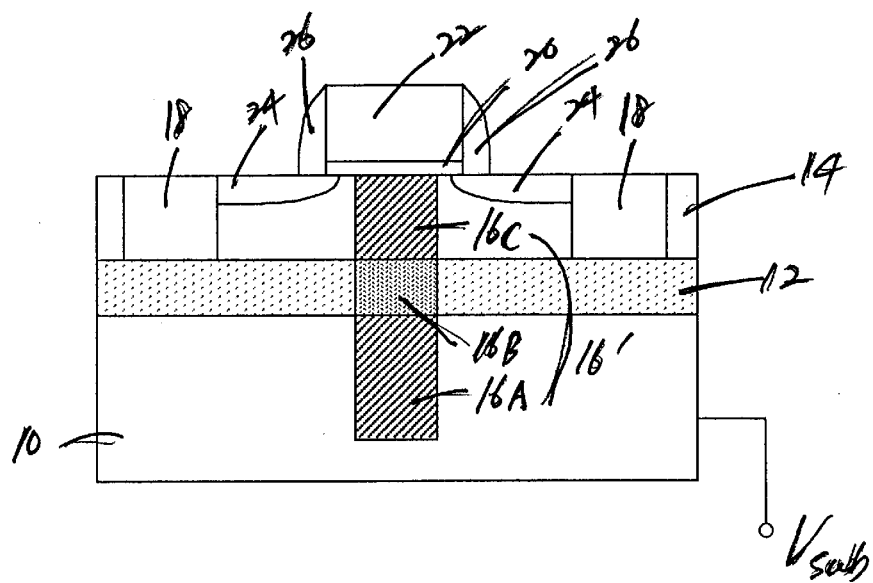
FIG. 3F depicts the portion of FIG. 3E after a local isolation process and a transistor formation process.

Subsequently, as depicted in FIG. 3F, an electric device is formed on the top semiconductor layer 14 within the device region. For example, FIG. 3F shows a transistor having a gate electrode 22 and source/drain regions 18 is formed on the SOI substrate. Since the top epitaxial silicon portion 16C of the body contact 16' provides an identical electrical characteristics, the transistor can be formed overlying the body contact 16'. However, depending on applications, the locations of the body contact 16' can be varied and it may not be necessary to position the transistor to overlie the body contact 16'.

Thus, according to the present invention, no space of the SOI substrate is wasted for implementing a body contact, no additional circuitry or conductive path is required to electrically connect a body contact and a device region, but it still provides predictable electrical characteristics without sacrificing the benefits attained from using the SOI substrate and conservation surface space on the semiconductor die.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A semiconductor device comprising:
   a silicon-on-insulator (SOI) substrate having top and bottom semiconductor layers separated by an insulator therebetween;
   local insulation regions formed in said top semiconductor layer of said SOI substrate;
   a device region formed between said local insulation regions, said device region comprising a gate electrode having sidewalls formed on said top semiconductor layer with a gate oxide therebetween, source and drain regions formed in said top semiconductor layer with a channel region therebetween, and sidewall spacers formed on said sidewalls of said gate electrode; and
   contact formed within said channel region, said contact directly underneath and contacting said gate oxide, extending between said top and bottom silicon layers and electrically connecting said top and bottom semiconductor layers.

2. The semiconductor device of claim 1, further comprising an electric device positioned on said SOI substrate within said device region.

3. The semiconductor device of claim 2, wherein said electric device is positioned overlying said contact.

4. The semiconductor device of claim 3, wherein said electric device is a transistor.

5. The semiconductor device of claim 1, wherein said contact comprising top and bottom epitaxial silicon portions with a polysilicon portion therebetween.

6. A semiconductor device comprising:
   a silicon-on-insulator (SOI) substrate having top and bottom semiconductor layers and a buried insulation layer therebetween;
   a plurality of local insulation regions formed on said SOI substrate;
   a device region formed between said plurality of local insulation regions wherein said plurality of local insulation regions separate said device region from a peripheral region, said device region comprising a gate electrode having sidewalls formed on said top semiconductor layer with a gate oxide therebetween, source and drain regions formed in said top semiconductor layer with a channel region therebetween, and sidewall spacers formed on said sidewalls of said gate electrode;
   a contact extending from said top semiconductor layer to said bottom semiconductor layer via said buried insulation layer and electrically connecting said top and bottom semiconductor layers, said contact formed within said channel region and directly underneath and contacting said gate oxide; and an electric device formed on said SOI substrate within said device region.

7. The semiconductor device of claim 6, wherein said contact comprises a semiconductor material having a lattice structure matching with that of said top and bottom semiconductor layers.

8. The semiconductor device of claim 7, wherein said semiconductor material is an epitaxial semiconductor material.

9. The semiconductor device of claim 8, wherein said epitaxial semiconductor material is selected from the group consisting of intrinsic silicon, SiGe and GaAs.

10. The semiconductor device of claim 7, said contact further comprises polysilicon.

11. The semiconductor device of claim 10, said contact comprising top and bottom epitaxial silicon portions and a middle polysilicon layer.

12. The semiconductor device of claim 1, said contact comprising top and bottom epitaxial silicon portions with a polysilicon portion therebetween with said top and bottom epitaxial silicon portions corresponding to the top and bottom semiconductor layers and said polysilicon portion corresponding to said insulator.

13. The semiconductor device of claim 6, said contact comprising top and bottom epitaxial silicon portions and a middle polysilicon layer with said top and bottom epitaxial silicon portions corresponding to the top and bottom semiconductor layers and said palysilicon layer corresponding to said buried insulation layer.

14. A semiconductor device comprising:

a silicon-on-Insulator (SOI) substrate having top and bottom semiconductor layers separated by an insulator therebetween;

local Insulation regions formed in said top semiconductor layer of said SOI substrate;

a device region formed between said local insulation regions, said device region comprising a gate electrode having sidewalls formed on said top semiconductor layer with a gate oxide therebetween, source and drain regions formed in said top semiconductor layer with a channel region therebetween, and sidewall spacers formed on said sidewalls of said cate electrode;

an electric device positioned on said SOI substrate within said device region; and a contact formed within said channel region, said contact directly underneath and contacting said gate oxide in said device region, extending between said top and bottom silicon layers and electrically connecting said top and bottom semiconductor layers and said electric device.

15. A semiconductor device comprising:

a silicon-an-insulator (SOI) substrate having top and bottom semiconductor layers separated by an insulator therebetween;

local insulation regions formed in said top semiconductor layer of said SOI substrate;

a device region formed in said top semiconductor layer of said SOI substrate and situated between said local insulation regions; and a contact formed within said device region and extending between said top and bottom silicon layers and electrically connecting said top and bottom semiconductor layers, said contact comprising top and bottom epitaxial silicon portions with a polysilicon portion therebetween with said top and bottom epitaxial silicon portions corresponding to the top and bottom semiconductor layers and said polysilicon portion corresponding to said insulator.

\* \* \* \* \*